United States Patent
Kaufmann et al.

(10) Patent No.: US 8,843,352 B2
(45) Date of Patent: Sep. 23, 2014

(54) SYSTEM AND METHODS FACILITATING INTERFACING WITH A STRUCTURE DESIGN AND DEVELOPMENT PROCESS

(75) Inventors: Michelle Kaufmann, Novato, CA (US); Eric Teller, San Francisco, CA (US); Alena Fong, Fremont, CA (US); Nicholas Chim, San Francisco, CA (US); Cedric Dupont, San Francisco, CA (US)

(73) Assignee: Google Inc., Mountain View, CA (US)

( * ) Notice: Subject to any disclaimer, the term of this patent is extended or adjusted under 35 U.S.C. 154(b) by 471 days.

(21) Appl. No.: 13/211,225

(22) Filed: Aug. 16, 2011

(65) Prior Publication Data

US 2013/0046512 A1  Feb. 21, 2013

(51) Int. Cl.
 *G06F 17/50* (2006.01)
(52) U.S. Cl.
 CPC .................................. *G06F 17/5004* (2013.01)
 USPC ................... 703/2; 703/6; 345/619; 715/762; 715/763
(58) Field of Classification Search
 CPC ................................ G06F 17/50; G06F 13/00
 USPC .......................................... 703/2, 6; 345/619
 See application file for complete search history.

(56) References Cited

U.S. PATENT DOCUMENTS

| 5,535,320 | A | 7/1996 | Gay et al. |
|---|---|---|---|
| 6,643,784 | B1 | 11/2003 | McCulligh |
| 6,859,768 | B1 | 2/2005 | Wakelam et al. |
| 6,873,942 | B1 | 3/2005 | Suga |
| 6,928,384 | B2 | 8/2005 | Kochi |
| 7,133,551 | B2 | 11/2006 | Chen et al. |
| 7,912,692 | B2 | 3/2011 | Matsushita et al. |
| 2006/0075718 | A1 | 4/2006 | Borne et al. |
| 2007/0083421 | A1 | 4/2007 | McNair et al. |
| 2007/0236509 | A1* | 10/2007 | Eldridge et al. ............... 345/619 |
| 2007/0240067 | A1* | 10/2007 | Eldridge et al. ............... 715/762 |
| 2007/0240070 | A1* | 10/2007 | Eldridge et al. ............... 715/763 |
| 2008/0126023 | A1 | 5/2008 | Hoguet |
| 2008/0174598 | A1 | 7/2008 | Risenhoover |
| 2009/0100368 | A1 | 4/2009 | Look et al. |
| 2009/0128558 | A1 | 5/2009 | Morello et al. |

(Continued)

FOREIGN PATENT DOCUMENTS

GB  2467852 A  8/2010

OTHER PUBLICATIONS

U.S. Appl. No. 13/112,727, filed May 20, 2011, Teller et al.
U.S. Appl. No. 13/163,307, filed Jun. 17, 2011, Teller et al.

(Continued)

*Primary Examiner* — Thai Phan
(74) *Attorney, Agent, or Firm* — McDonnell Boehnen Hulbert & Berghoff LLP

(57) ABSTRACT

A computer-implemented system for designing a structure based on an initial depiction is disclosed. The system includes a design engine that receives the depiction and various other inputs and produces a structure design therefrom. The depiction is analyzed to determine a representation, and cells instantiated to populate the representation. Cells are configured to be assembled together with other cells to form the structure design, including systems of the design. An initial proposed design may be iteratively improved using one or more measures of the proposed structure design's goodness, such as conformance to the depiction's shape, style, volume, etc. Creation of the depiction may be in the context of the building site, from which additional information may be derived in the process of creating a proposed structure design.

40 Claims, 10 Drawing Sheets

(56) References Cited

U.S. PATENT DOCUMENTS

| | | |
|---|---|---|
| 2009/0234696 A1 | 9/2009 | Attia |
| 2010/0049477 A1 | 2/2010 | Sivan |
| 2010/0070241 A1 | 3/2010 | Opdahl et al. |
| 2010/0106464 A1 | 4/2010 | Hlasny et al. |
| 2010/0198563 A1* | 8/2010 | Plewe ............................... 703/1 |
| 2010/0257457 A1 | 10/2010 | DeGoes |
| 2011/0010134 A1 | 1/2011 | Balla et al. |
| 2011/0047484 A1 | 2/2011 | Mount et al. |
| 2011/0054652 A1 | 3/2011 | Heil |
| 2011/0191069 A1 | 8/2011 | Madsen et al. |

OTHER PUBLICATIONS

U.S. Appl. No. 13/418,302, filed Mar. 12, 2012, Teller et al.
U.S. Appl. No. 13/163,424, filed Jun. 17, 2011, Teller et al.
U.S. Appl. No. 13/237,681, filed Sep. 20, 2011, Chim et al.
U.S. Appl. No. 13/237,735, filed Sep. 20, 2011, Chim et al.
U.S. Appl. No. 13/342,162, filed Jan. 2, 2012, Teller et al.
Anderson, Lee, et al. "A Virtual Environment for Conceptual Design in Architecture", International Immersive Projection Technologies Workshop, Eurographics Workshop on Virtual Environments (2003).
Larson, K., chapter titled "Open Source Living", Building (in) the Future: Recasting Labor in Architecture, ed. Deamer and Bernstein, pp. 100-113 (Yale School of Arch., 2010).
Onuma Systems products—info at http://onuma.com/products/OnumaPlanningSystem.php (May 6, 2010).
Digital Project, Gehry Technologies—info at http://www.gehrytechnologies.com/index.php?option=com_content&task=view&id=97&Itemid=211 (2011).
Autodesk Revit—info at http://usa.autodesk.com/revit-architecture/ (2011).
Autodesk Vasari—info at http://labs.autodesk.com/utilities/vasari/ (2011).
Autodesk Ecotect Analysis—info at http://usa.autodesk.com/adsk/servlet/pc/index?siteID=123112&id=12602821 (2011).
Autodesk AutoCAD—info at http://usa.autodesk.com/autocad/ (2011).
Duke University open source structural analysis package—info at http://frame3dd.sourceforge.net/ (Sep. 13, 2011).
Graphisoft ArchiCAD—info at http://www.graphisoft.com/products/archicad/ (2011).
Chen, P. et al., "Implementation of IFC-based web server for collaborative building design between architects and structural engineers", Auto. in Constr., vol. 14, pp. 115-128 (Elsevier, Aug. 27, 2004).
Setareh, m. et al., "Development of a collaborative design tool for structural analysis in an immersive virtual environment", pp. 1-6, (Virginia Poly Tech. Inst. and State Univ., Feb. 14, 2011).
Luo, Y. "Cooperative Design in Building Construction", pp. 93-108 (Univ. Balearic Islands, Spain, May 10, 2007).
Scheer, S. "Building design teamwork supported by a collaborative CAD modeling process analysis", (Nottingham Univ. Press, May 30, 2010).
PCT/US2012/03845, Search report for corresponding PCT application.
Revit User's Guide, Apr. 2010, Autodesk, pp. 9-10,19, 32, 55-56, 523, 1029, 1102, 1106-1107, 1117, 1119, 1227-1228, 1233, 1257, 1279, 1361, 1371, 1407,1413, 1507, 1509, 1591, 1646.

* cited by examiner

SYSTEM AND METHODS FACILITATING INTERFACING WITH A STRUCTURE DESIGN AND DEVELOPMENT PROCESS

CROSS-REFERENCE TO RELATED APPLICATIONS

The present disclosure is related to and claims priority from copending U.S. patent application titled "System and Methods for Structure Design, Analysis, and Implementation", Ser. No. 13/112,727, filed on May 20, 2011, which is incorporated herein by reference.

COPYRIGHT NOTICE

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND

The present disclosure is related to the design and realization of structures such as buildings, and more specifically to systems and methods for interfacing with the structure design and development process by way of a sketch, model or similar depiction.

Traditionally, the process of designing and building a structure begins with an architect or other party sketching conceptual ideas for the structure. Most commonly, an architect's initial sketches are done in pen or pencil, usually starting with a blank sheet of paper, allowing conceptual ideas to flow quickly and freely. The sketches may go through a number of iterations until the design is sufficiently refined that the parties feel it is ready for more formal rendering. A draftsman (or a team of draftsmen) then turns the sketches into drafts of architectural plans. For larger, more complex structures, the process branches at this point such that different professionals develop different aspects of the plans, such as foundation, superstructure, curtain walls, heating, ventilation, and air conditioning (HVAC), interior design, and so forth.

While in one sense the term "sketch" implies a degree of informality and generalization, for a client to appreciate the design and for a draftsman to accurately capture the architect's intent in architectural plans, the sketches must be reasonably detailed and accurate. Yet, they must be fluid enough that design ideas can still be introduced (or removed) quickly and easily. The sketches are intended to both display and elicit ideas. For this reason, to reach a reasonable degree of completeness, sketches themselves may be the subject of numerous iterations, refinements, and redrawing. This sketch-and-refine process takes place before numerous practical considerations can be factored into the design, such as cost, structural and site limitations, and so forth.

In some cases, the design of a structure is intended to be unique and specific to a client. The draftsman's role in such cases is to create working drawings (e.g., blueprints or building plans) that capture the design intent evidenced in the architect's sketches. In other cases, the design starts with or references an existing structure's design or style. In these cases, the architect's sketches, and ultimately the draftsman's working drawings attempt to integrate the architect's conceptual ideas with the styles represented in the existing structure.

In certain projects, a model building process may follow the sketch process. The model may still be conceptual, and provides a three-dimensional view of a proposed structure. Models, like sketches are intended to both illustrate and elicit design ideas. Therefore, models may be constructed such that they can be easily reconfigured to explore design ideas.

This sketch (and model) refinement process is well established and historically has been a relatively effective practice. However, a number of modern developments challenge the effectiveness of such practices. For example, there is ever-increasing pressure to reduce the time required to produce a complete building design. The less time required to design, the lower the cost of the design process and the quicker the structure can move to the building stage.

Furthermore, there is an increasing use of alternatives to paper and pen to do sketching. Computer-based design using tools such as Google Sketch-Up, AutoDesk AutoCAD, and the like provide many advantages, such as repeatability, speed, visualization, and so on, over hand drawing for certain types of designs. Relatively low-cost three-dimensional printers are now available, permitting rapid and relatively inexpensive model building. Systems are also emerging that permit assembling building designs from a palette of building blocks, as well as systems that make or highlight design choices for a user based on rules governing attributes of the structure from an examination of a computer-based drawing of the structure.

Still further, use of photographs, video, and other non-hand drawn sources of design inspiration are increasingly common. Historically, there has been no better way to capture design inspirations found in sketches, models, photos, video, event entire completed structures, than to attempt to copy them, which is very dependent on the artistic ability of the architect or designer, with results varying accordingly.

In addition, perspective illustrations have been used to show a proposed structure in place on its site. Capable architects and designers can produce such illustrations that look quite realistic. However, there has historically been no simple and visually compelling way to actually superimpose a sketch (or other rendering) in place and on its site.

While computer drafting is quickly becoming the norm, the method of modifying drawings remains traditional. The drawings are marked up on a printed copy thereof, and then a skilled professional interprets those markups and modifies the computer-based drawings accordingly.

In summary, systems are not yet available which effectively permit rapid and simple initiation of a structure design from sketches. Merely scanning a sketch into a computer is not sufficient, as there is a lack of known machine capability to interpret the sketch and create a working plan therefrom. Thus, sketches are still manually transformed into working drawings. The same holds true for physical models of structures. Point clouds can be determined for such models, but known systems are not able to adequately interpret the data, make myriad decisions about a structure's workings from that data, and render a complete design for the structure. Instead, the sketches and models serve merely as a template for the more complete, manual design development and refinement process performed by additional professionals. And, once the structure design and development produces a working structure design, existing systems and practices do not facilitate detailed modifications directly from a physical markup of the working structure design (e.g., hand-drawn changes to printed plans).

SUMMARY

Accordingly, the present disclosure is directed to systems and methods for more efficiently designing a structure and facilitating its implementation than heretofore possible. A number of different methods and systems are disclosed for relatively simply inputting, modifying, and quickly developing a structure design. Design optimization and processes to tailor the design to meet various targets may provide design refinements substantially in real-time, providing a user with real-time feedback about design decisions and modifications. Aspects of a preliminary conceptual design, such as cost and build time estimates, consideration of structural limitations, and so forth, may quickly be evaluated, in some case literally as the conceptual design is emerging at the hand of the designer. In addition, a more rapid path to build documentation may be realized.

According to aspects of the disclosure, designing a structure is initiated or otherwise facilitated by creating or inputting one or more "depictions" of the structure. As used herein, "depiction" is intended to mean a representation in one or more of a wide variety of media such as hand drawing (e.g., a sketch) on paper, hand drawing or computer-assisted drawing on an electronic device (e.g., a tablet computer), sculpture (e.g., a model), photograph, digital file (e.g., a computer drawing such as a CAD file), etc. "Representation" as used herein is intended to mean an intermediate form of the design, such as an outline (wireframe), footprint, cross-section or the like. A more complete version, possibly illustrating exterior materials, internal systems, and so forth, is referred to herein as a "structural design". In one sense, the relative completeness of a design increases from depiction to representation to structural design.

One or more depictions may be interpreted by the methods and systems disclosed herein to initiate a more complete system-based structure design. From the system-based design preliminary data relating to a structure according to the depiction may quickly be calculated and presented. Furthermore, aspects of the structure at various stages of the design process may be modified (or modifications thereto explored) using a depiction modification methodology.

Accordingly, a computer-implemented system and method for designing a structure is provided which comprises: an input subsystem for inputting a depiction of a structure; an analysis subsystem, communicatively coupled to the input subsystem, for analyzing the depiction in order to determine aspects of the structure indicated in the depiction; a design engine, communicatively coupled to the analysis subsystem, for generating a proposed structure design based on the aspects of the structure indicated in the depiction by instantiating and interconnecting a plurality of cells; a goodness measurement subsystem, communicatively coupled to the design engine, for calculating a goodness measure indicative of how well the proposed structure design matches the depiction; and a display device for displaying a rendering of the proposed structure design in a design workspace; whereby the design engine is configured to refine the proposed structure design in response to the goodness measure.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that description of well-known processes, components, equipment, and other well-known details are merely summarized or are omitted so as not to unnecessarily obscure the details of the present invention. Thus, where details are otherwise well known, we leave it to the application of the present disclosure and the knowledge and ability of one skilled in the art to suggest or dictate choices relating to those details.

Figure 1:
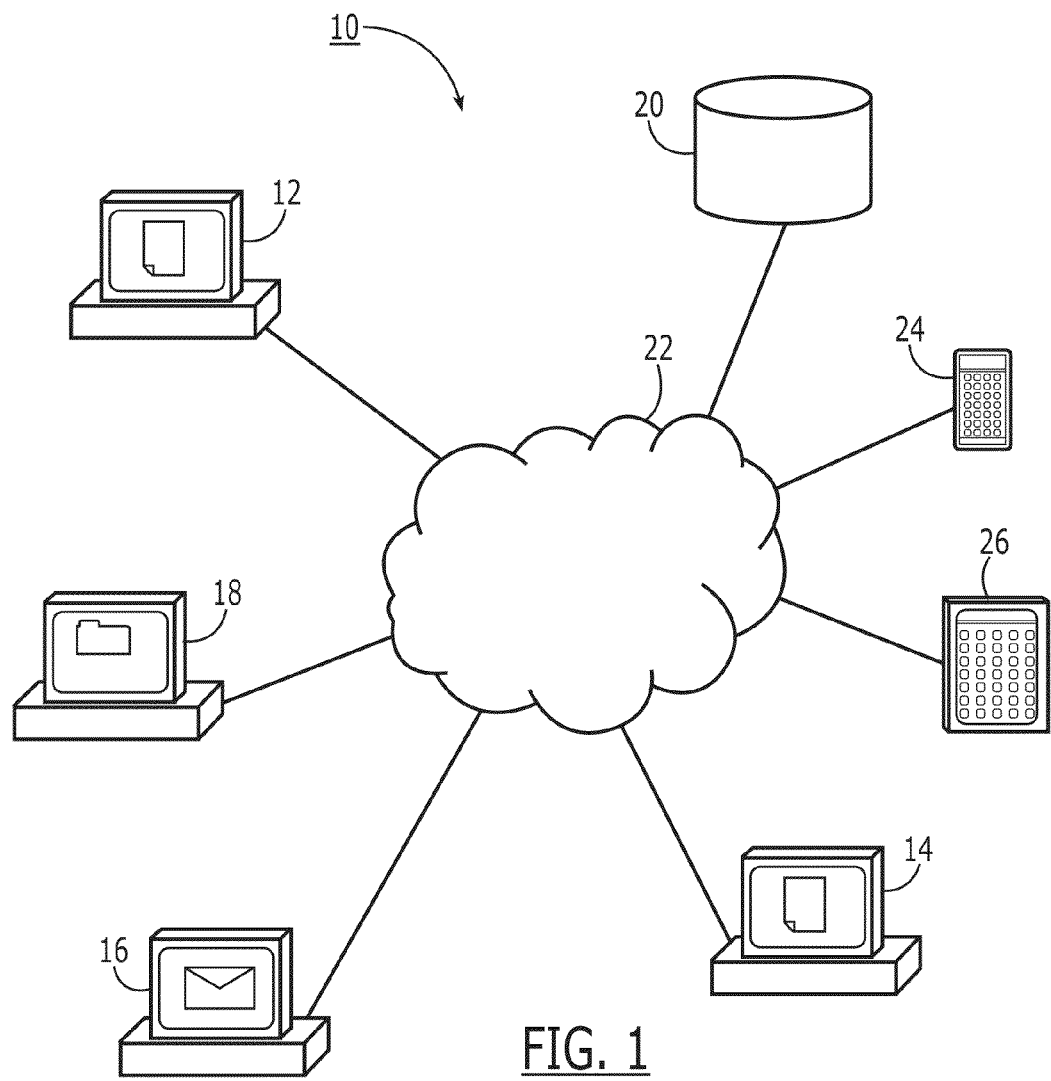
FIG. 1 is a high-level representation of a distributed network environment, comprising hardware and software, within which various embodiments of a system for structure design, analysis, and implementation according to the present disclosure may be employed.

With reference initially to FIG. 1, a distributed network environment 10 is shown, comprising hardware and software, within which various embodiments of the present disclosure may be employed. More specifically, distributed network environment 10 comprises multiple interconnected elements of hardware, each running software, allowing those elements of hardware to communicate with one another, whether by wired or wireless connection. Such elements of hardware include, but are not limited to, a first client workstation 12, a second client workstation 14, a mail server computer 16, a file server computer 18, and network appliances 20 such as remote storage, each communicating via the public Internet 22. The client workstations and servers generally may be referred to as computer devices. Other computer devices, such as mobile computationally-enabled telephone handsets (so called "smart phones") 24, tablet-style computer devices 26, and so on may also form a part of network environment 10.

Alternatives to using the public Internet, or additional interconnection mechanisms include local area networks (LANs), wide area networks (WANs), etc. Alternatives to client workstations, or additional computer mechanisms include personal computers, servers that are personal computers, minicomputers, personal digital assistants (PDAs), mainframes, etc. The network within which the various embodiments of the present disclosure operates may also comprise additional or fewer devices without affecting the scope of the present disclosure.

First and second client workstations 12, 14, smart phone 24, tablet computer 26, etc. may communicate via the public Internet 22 using known Web browser software or dedicated, specific-purpose application software. As is well known, software components supporting client workstations 12, 14, servers 16, 18, and network appliances 20, smart phone 24, and tablet computer 26 include or reference logic and/or data that may form a part of the software component or be embodied in or retrievable from some other hardware of software device or signal, either local or remote and coupled via a network or other data communications device.

Thus, embodiments of the invention may be implemented as methods, apparatus, or articles of manufacture as or in software, firmware, hardware, or any combination thereof. As used herein, article of manufacture (or alternatively, computer program product) is intended to encompass logic and/or data accessible from any computer-readable device, carrier, or media.

Those skilled in the art will recognize many modifications may be made to this exemplary environment without departing from the scope of the present disclosure. For example, it will be appreciated that aspects of the present disclosure are not dependent upon data structure formats, communications protocols, file types, operating systems, database management system, or peripheral device specifics. Accordingly, the following description is provided without reference to specific operating systems, protocols, or formats, with the understanding that one skilled in the art will readily be able to apply this disclosure to a system and format of choice.

The present disclosure provides a computer-implemented system and methods for producing a design of a structure and coordinating aspects of its implementation. As used herein, a "structure" may be, but is not limited to, habitable buildings, functional structures, artistic structures, and so on, and the nature of the structure does not form a limitation on the scope of the present disclosure. Furthermore, as used herein, "designing" is intended to mean all aspects of preparing plans for implementing a structure, including but not limited to developing a set of documents that describe a structure and aspects of its construction, as well as estimates relating to the design and construction of the structure. Designing a structure may optionally include designing or selecting the materials and processes for obtaining prerequisite certifications and approvals for constructing a structure. Still further as used herein, "implementation" is intended to mean verifying aspects of a design, arranging accessibility to required parts, services, and personnel, maintaining a project timeline, maintaining a project budget, managing changes during the build phase, financing and insurance, and constructing the structure. Optionally, implementation may also include coordinating and obtaining approvals, permits, and the like.

According to the present disclosure, a user may initiate a design process not only by interacting with a computer system and controls provided thereby, but also by inputting to the computer system data about a design in the form extracted from a depiction of the design. The depiction may be on paper, be a three-dimensional model, or other non-computer based form, or alternatively may be computer based ab initio. In the process of using depiction data to develop a proposes structure design, the system may communicate with other systems to obtain data, verify data, deliver data, store or retrieve data, etc. Those other systems may be interfaces to other computer-user interactions or be autonomous or some combination of the two. As used herein, "interface" is intended to include data structures, virtual and physical connections between devices, computer-human user interface, and other mechanisms that facilitate the exchange of data between computer system and/or control of one or more such systems. In one embodiment, an interface requires a minimum or no user data entry or manual delivery of data from one system to another. In another embodiment, data that needs to be entered manually may be retained and reused within the system, reducing future data entry requirements.

Figure 2:
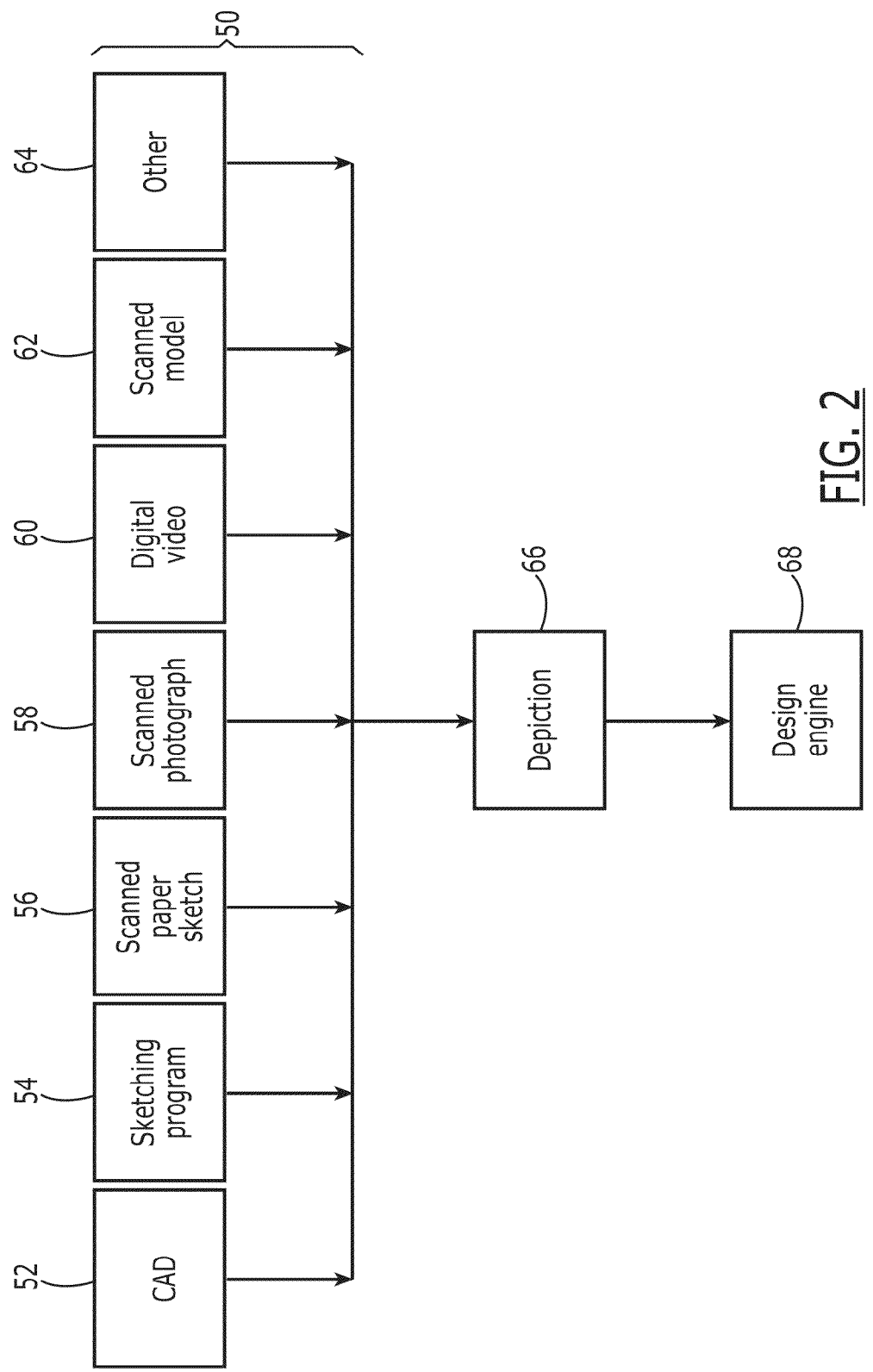
FIG. 2 is a schematic illustration of various forms of imputing a depiction to a computer-implemented system utilizing depiction data as a basis for designing a structure according to the present disclosure.

In general, a method of designing a structure employing a system of the type disclosed herein begins with a user creating one or more "depictions" of the structure. With reference to FIG. 2, a depiction according to the present disclosure may be created from one or more of a variety of input devices 50. One such input device may be a workstation or similar computing device running a computer-aided design (CAD) program 52, such as AutoCAD (http://usa.autodesk.com/autocad/), Revit (http://usa.autodesk.com/revit-architecture/), and the like, or a drawing or sketching program 54, such as Google Sketch-Up (http://sketchup.google.com/). Such programs may produce representations of a structure, illustrating features such as walls and windows, but without semantic meaning (e.g., such systems do not utilize the knowledge that a feature is a window, as opposed to a door, for design and analysis operations specific to a window).

Another such input device may be a scanner for scanning a paper sketch 56 or a photograph 58. A digital image or video device 60, such as a digital camera or video recorder or storage device providing a digital image or video file may also be employed as a depiction source. A three-dimensional model-scanning device 62, such as a coordinate measuring machine (CMM), optical (i.e., laser) scanner, computed tomography (CT) scanner, point-capture model and scanner, etc., may alternatively be employed to create a data file from a form, model of a structure, etc. Other devices 64 beyond those listed above may also be employed. Each of these devices produces one or more files 66 that represent the depiction, which is input to design engine 68.

Furthermore, the data file provided by one or more of these devices may form a starting point for refinement and modification by other of these devices to thereby create a depiction of a structure. For example, three-dimensional scanner 62 may be used to scan a physical object to create a computer image, that computed image modified using sketching program 54, and the file produced thereby serving as the depiction of the structure for input to design engine 68. Many other combinations and permutations of starting, intermediate, and end-points for generating a depiction file are contemplated hereby, as will be appreciated by one skilled in the art.

Figure 3:
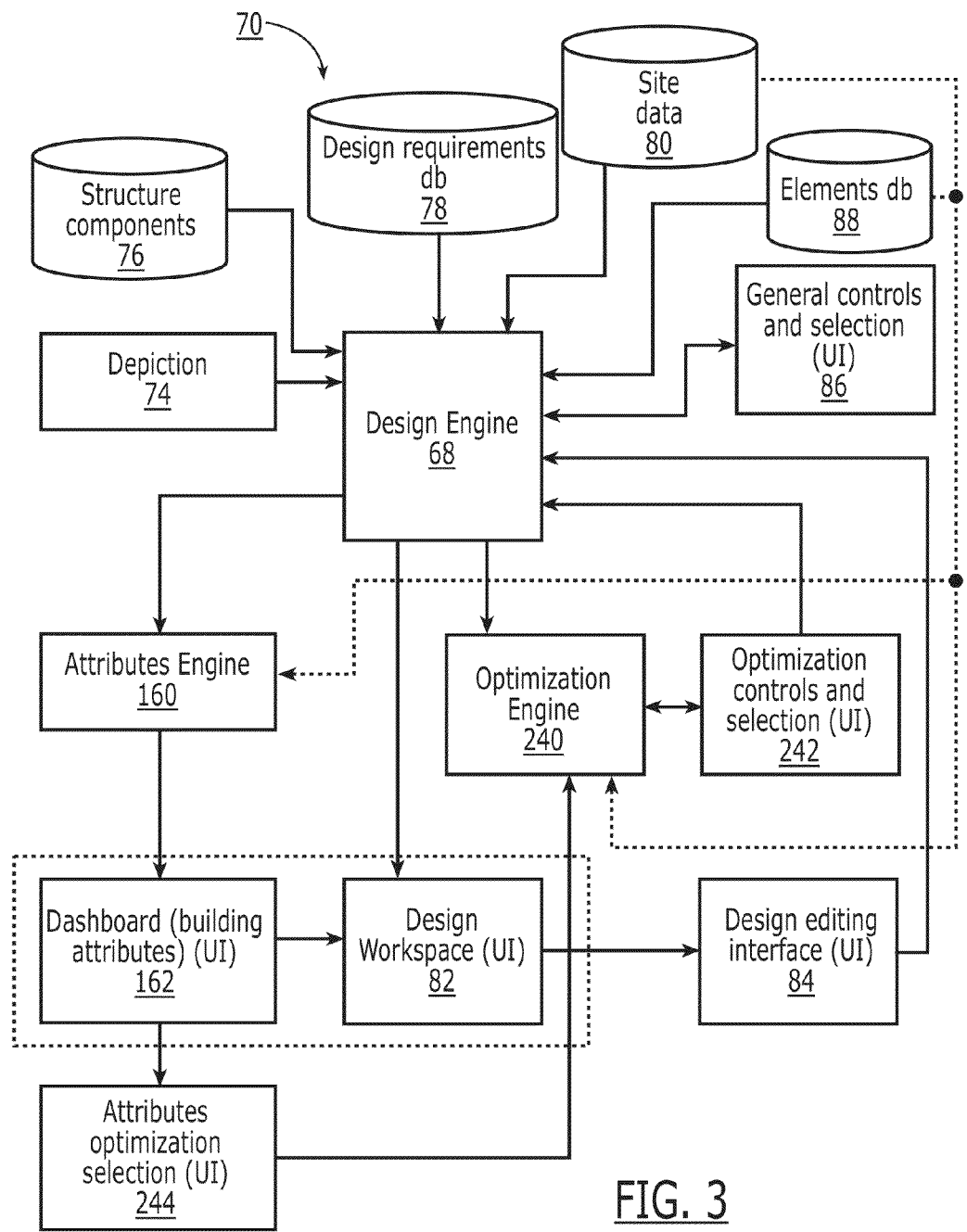
FIG. 3 is a schematic diagram of a first embodiment of a computer-implemented system for structure design, analysis, and implementation, utilizing depiction data as a basis for designing a structure, according to the present disclosure.

With reference to FIG. 3, a schematic diagram of a portion of a first embodiment of a computer-implemented system 70 that may utilize a depiction file as a basis for designing a structure and coordinating its implementation is shown. Design engine 68 forms a portion of embodiment 70 that manages aspects of the structure design process. Design engine 68 may be realized in software, firmware, hardware, etc.

Design engine 68 receives one or more various inputs including one or more depiction files 66 from depiction interface 74, structure component (e.g., cell) definitions from structure components database 76, design requirements from design requirements database 78, data about the site from site data database 80, and possibly other inputs (not shown). While a number of these data inputs are shown and discussed in terms of databases, it will be appreciated that other forms of data input, such as streaming data, real-time measurement data, calculated data, etc. may also be employed. Additional instructions to design engine 68, such as which assumptions to make, which goodness measure (discussed further below) to use, and so on may be input or modified from prior settings or defaults, including specific defaults for individual users (i.e., defaults that vary from user to user).

The user may also be provided with an interface 86 to input or edit a number of other controls affecting structure design and decisions by design engine 68 related thereto. For example, a user may specify preferences or targets for items such as maximum cost, build time, square footage, efficiency, etc. A user may specify preferences for how to interpret geometric aspects of a depiction, such as round all corners, or do not permit "holes" in structure. A user may specify certain invariants, such as scale entire structure, make all corners perpendicular in plan view. Controls may be provided to specify relative importance. For example, a proposed structure should maximize window space at the cost of energy efficiency. Once specified, some or all of the user preferences may be retained and invoked when the user interacts with the system unless otherwise changed. It may also be the case that a user lacks sufficient authority to change certain controls (or conversely may have authority to change controls for other users).

Design engine 68 provides an output in the form of data representing a structure that is rendered in a design workspace user interface (UI) 82. Design engine 68 may include rendering capabilities, or may rely on additional tools, such as Google SketchUp to perform rendering tasks. Design workspace UI 82 provides a user with a visual representation of the structure being designed, as well as a design-editing interface 84 at which a user may edit the proposed design.

It will be appreciated that the various elements shown in FIG. 3 may be physically interconnected, connected by way of a wireless connection, or may be indirectly interconnected by way of additional elements, such as servers, routers, data switches, and so forth. In general, the communication between the various elements shown in FIG. 3 may be essentially real-time, subject to the processing time of one or more elements in the communication channel, or may buffered.

According to the aforementioned U.S. patent application Ser. No. 13/112,727, a structure may be composed of a number of interconnected elements referred to as "cells". Cells are abstractions of portions of a structure upon which other systems in the design depend, and may comprise a set of rules governing aspects of portions of a structure, such as how one part connects to another, size ranges of parts, systems or components included in or required by a part of a structure, and so on. These parts are instantiations of one or more cells. Thus, a structure design is populated by a plurality of such instantiations of cells.

Figure 4:
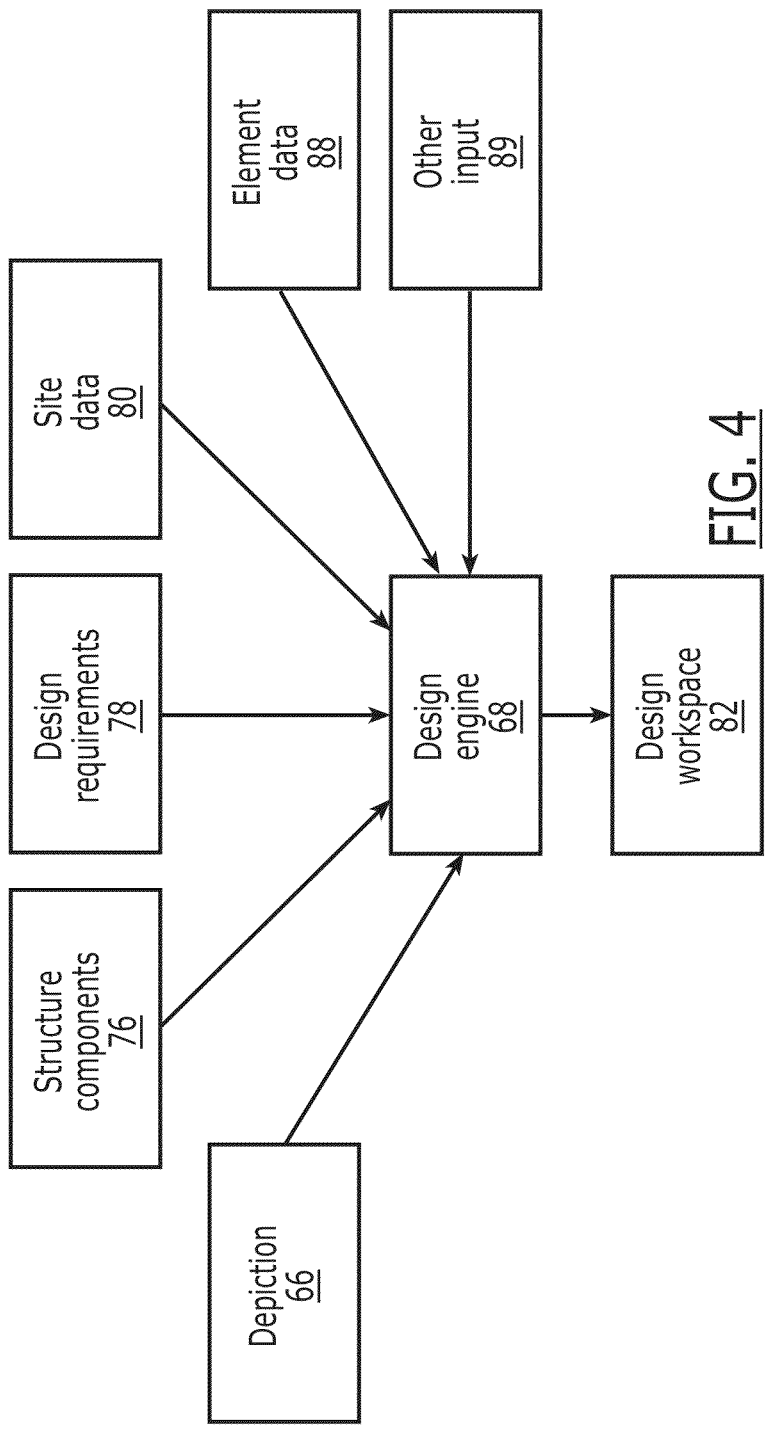
FIG. 4 is a schematic illustration of various inputs to a design in a system according to the present disclosure.

As discussed further below, design engine 68 analyzes the depiction data file and, possibly with rules and other data, determines a structure frame perimeter, footprint, or boundary, its scale, position, and other attributes for a structure represented by the depiction data. Structure components database 76 provide cell definitions to design engine 68. Design engine 68 instantiates cells that populate the structure frame perimeter, footprint, or boundary, creating a proposed structure design that represents the depiction. With reference to FIG. 4, in addition to depiction data 66, and structure and cell definitions 76, design requirements from design requirements database 78, site data and rules from site data database 80, elements data from elements database 88, and possibly other data and rules 89 are processed by design engine 68 to make decisions regarding instantiations of cells to populate the structure depiction. These data and rules may be explicit or may be derived algorithmically.

Certain aspects of a cell or its instances may be specified by these rules, while other aspects may be applied by design engine 68 when implementing the rules. For example, a rule may specify how the cell interacts with other cells in the design, such as how utilities (e.g., HVAC, electricity, water, data, and so on) are passed from one cell to the next. A rule may specify a size component (e.g., a dimension range for instances of a cell), a shape of cell (e.g., straight or rounded sides), a structural members component (e.g., how and where structural members such as columns are located), an interconnection component (e.g., where a cell may connect to another cell), a supplier identification component (e.g., specific suppliers for elements of the cell), an availability component (e.g., are elements specified in the cell readily available or do they take a longer than normal time to obtain), a cost component (e.g., what is the total cost of the elements specified for the cell), a health component (e.g., what level of exposure to specified substances will an occupant of a structure defined by the cell experience), an environmental efficiency component (e.g., energy use per cell), and so on. While some aspects of the cell may be rigidly defined by these rules, others may be adjusted to fit the design. For example, a cell may have a size range as opposed to an absolute size, allowing the system to choose a cell having a size range appropriate for the location.

The rules provided by cell and structure data database 76 may provide structural definitions, which are interpreted by design engine 68 to develop the structure. For example, one set of rules may require that a cell be supported at its corners by columns. In populating the footprint, two cells placed side-by-side may each be defined by such a rule. When assembled together by design engine 68, two adjacent cells may be combined together into a cell combination with any structurally redundant elements such as adjacent corner columns replaced by a single structurally equivalent element (i.e., two adjacent columns replaced by a single column). The rules provided by cell and structure data database 76 may also provide code-based definitions, such as ensuring an adequate egress, fresh air and water, power, communications, etc., for the size, elevation, intended use, and so forth of the parts of a structure.

Figure 5A:
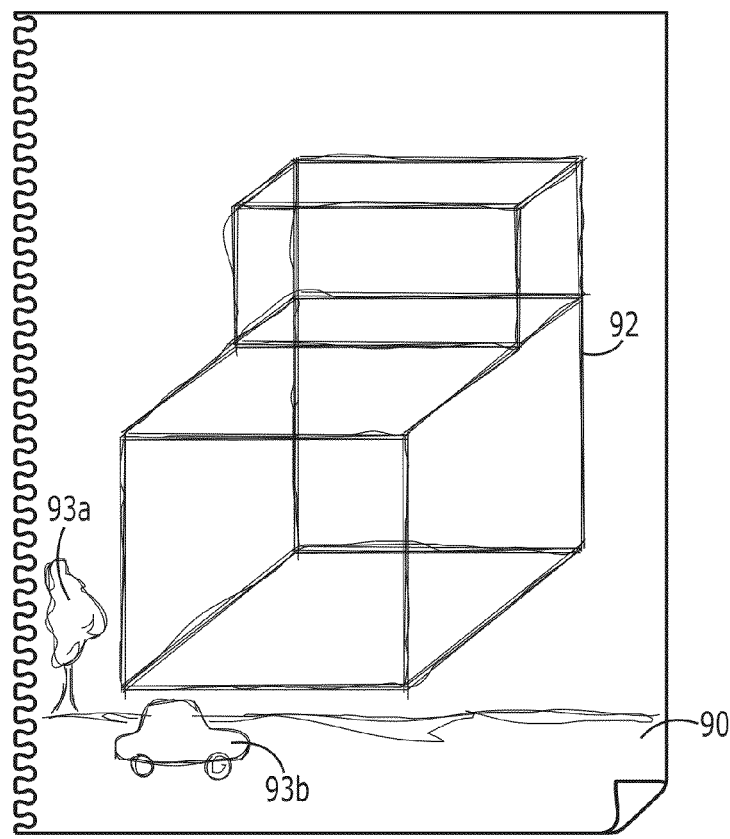
FIG. 5A is an illustration of a rough sketch of a structure that may serve as the basis for initiating a computer-implemented structure design method and system, according to the present disclosure.
Figure 5B:
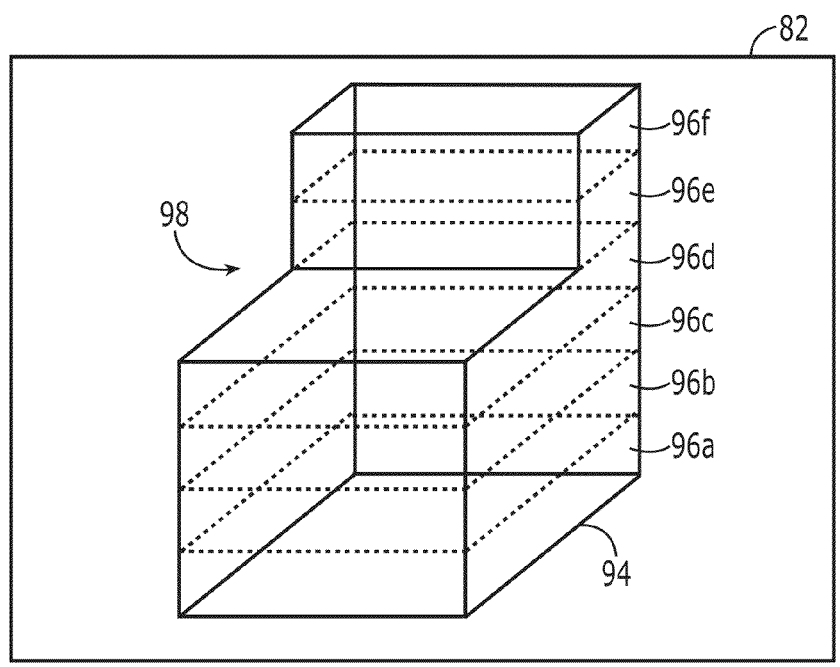
FIG. 5B is an illustration a proposed design for a structure, including indications of cells, provided by a computer-implement structure design method and system based on the sketch of FIG. 5A, according to the present disclosure.

As mentioned, design engine 68 interprets the depiction file to attempt to infer or derive the user's intent captured in the depiction. This means design engine 68 may attempt to determine from the depiction file form attributes, such as footprint, outline, shell, cross-section, etc. Using the one or more form attributes, design engine 68 then begins to assemble cell instantiations to approximate that depiction. This is illustrated in FIGS. 5A and 5B. In FIG. 5A, an architect (for example) has sketched on a piece of paper 90 a depiction 92 of a structure. In this case elements 93 are present and provide signals as to intended scale, orientation, and so on. This is a rough sketch, in which lines are not perfectly straight, perspective is not consistent, corners do not exactly meet, and so on. However, the general shape of the structure is apparent. This sketch is scanned, for example on a flatbed scanner or the like, and the depiction file produced by that scan input into the design engine. The design engine is able to determine from the depiction file an outline of the intended structure. With reference to FIG. 5B, the design engine interprets the scan data, develops a general outline 94 of a form that approximates the sketch. The outline 94 may then be populated with cells 96a, 96b, etc. Scale (size), material, and other design choices may be resolved with reference to defaults, preset user preferences, learned selections, identification of signals (e.g., elements 93) in the depiction data, and so forth, as discussed further below. A structure 98 is thus assembled by the design engine, which may be rendered for example in design workspace 82.

It will be appreciated that while structure 96 of FIG. 5B is not shown with systems such as stairs and elevators, HVAC, beams and joists, and so on, the foregoing discussion makes clear that a complete proposed design will include all systems necessary to provide a working, safe, code compliant structure that seeks to meet the program requirements for the structure, in a form determined from the initial depiction.

In the example shown in FIGS. 5A and 5B the depiction data was analyzed and an outline (wireframe) 94 built in software from the depiction data. This provided bounds within which cell instances could be placed. However, many other methods of analyzing the depiction data and providing a starting point for populating a proposed structure may be employed. For example, from the depiction data a structure footprint (i.e., plan view), geometric description (e.g., rectangular, triangular, cylindrical, etc. sections), structure cross-section, and other representations of a structure may be determined. While a single representation of a structure may be sufficient, it is also possible and in some cases desirable to determine and use multiple different representations to more accurately capture the intent of the depiction. The process of building out the representation of the structure with cell instances may then proceed as described.

Figure 6:
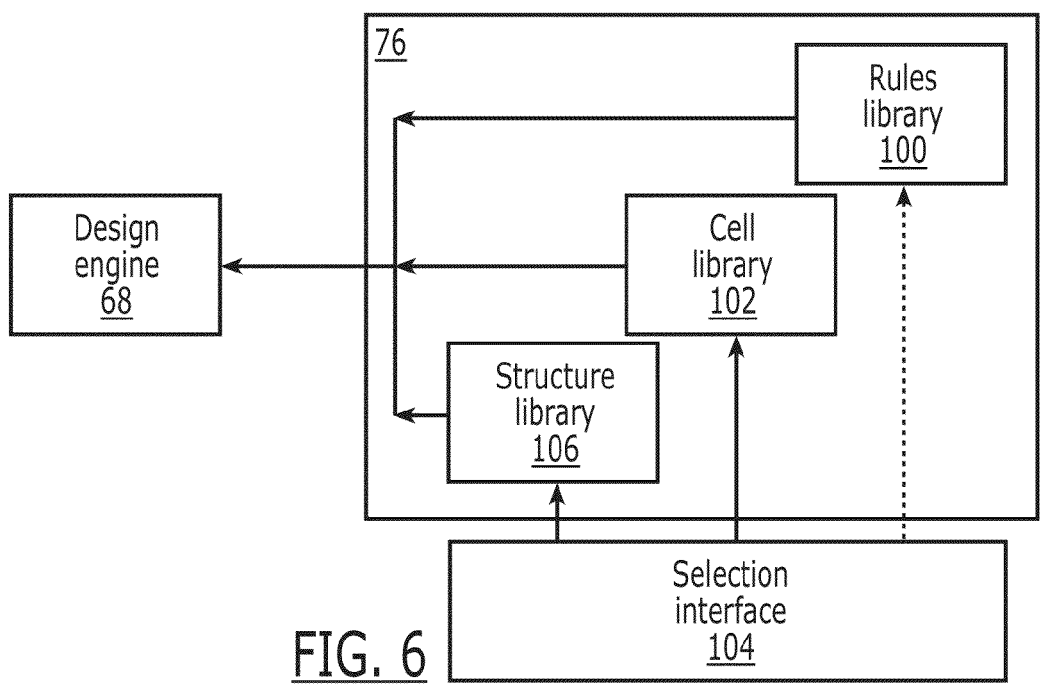
FIG. 6 is an illustration of one embodiment of a structure components database that includes or accesses a plurality of libraries for providing structure and cell definitions and rules in a system according to the present disclosure.

While the design engine may initially autonomously populate a representation with cell instantiations to produce a proposed structure, a user-accessible palette of pre-defined cell designs, structures, and elements may also be provided, and a user may manually edit a design in essentially a building-block process. FIG. 6 is an illustration of one embodiment of cell and structure data database 76 illustrating this point. Cell and structure data database 76 includes or accesses a rules library 100 for providing cell definition rules as previously described. In addition, database 76 may include or access a cell library 102 that provides a number of pre-established cell definitions and/or a resource for editing cell definitions and defining new cells. A user may access cell library 102 through a selection interface 104 or by other user interface to database 76. In addition to accessing and selecting cell definitions, cell and structure data database 76 may provide or access a structure library 106 which includes a number of pre-established partial or complete structures (e.g., buildings or parts thereof) which may form the a basis for at least part of the design produced by design engine 68. A user may access structure library 106 through selection interface 104 or by other user interface to cell and structure data database 76.

Figure 7:
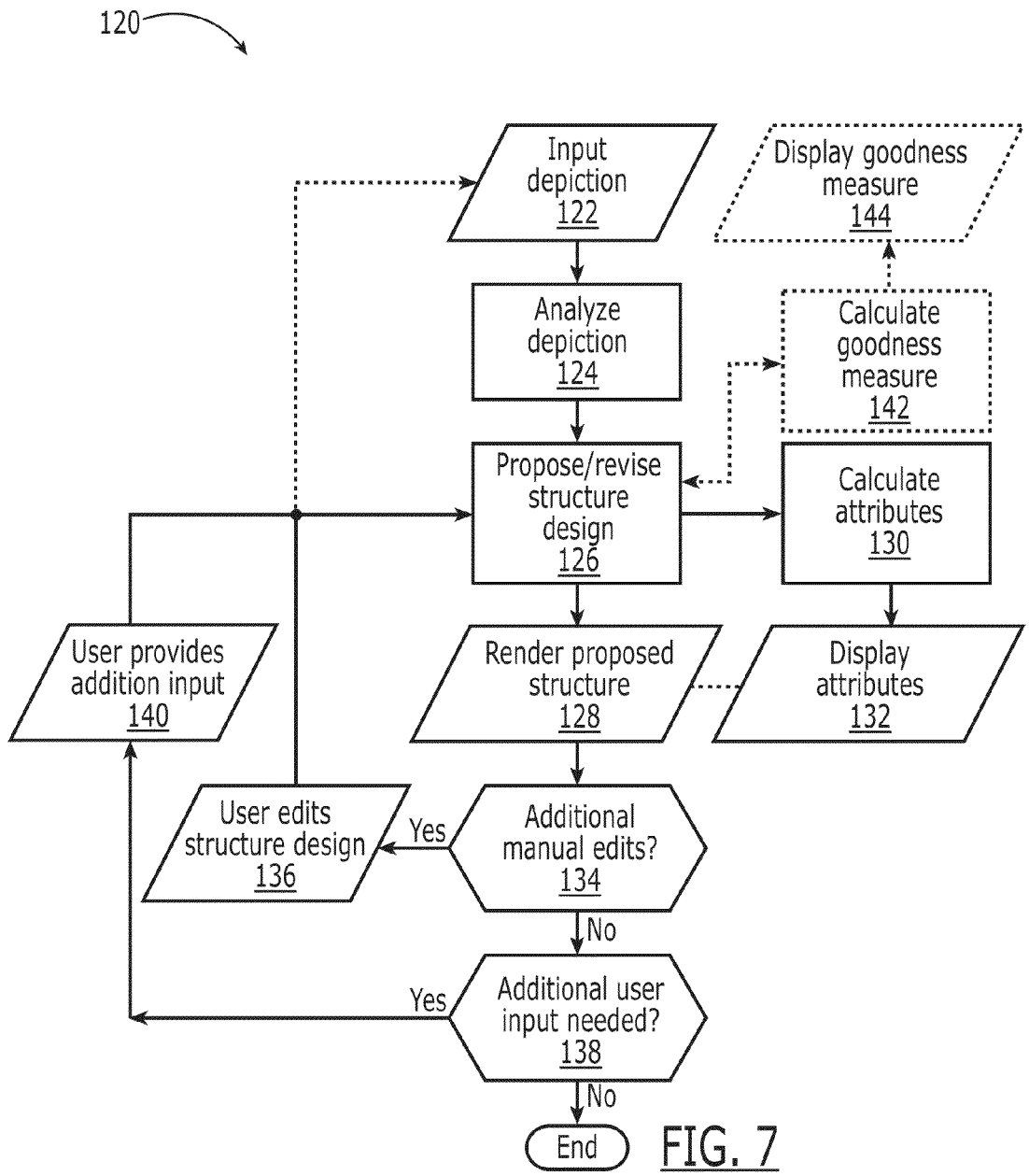
FIG. 7 is a flow chart illustrating a process for building a computer-based structure design from a depiction thereof, according to the present disclosure.

With reference next to FIG. 7, an embodiment 120 of a process for building a computer-based structure design from a depiction thereof is illustrated. The process begins with an input of a depiction at step 122. As previously mentioned, this may be by way of a scanned drawing or photograph, generation of a point cloud from a model, etc. At step 124, the depiction data is analyzed. One or more of various different analyses may be performed at step 124. For example, one analysis may seek to establish a structure perimeter (akin to a line drawing) of the depiction. In the fields of computer vision, machine vision, and imaging (as well as facial recognition, animation, and others), many well-known techniques exist for establishing the boundaries and features of an object in this way. One or more of these techniques may be applied to the depiction data in order to establish, for example, the perimeter (e.g., convex surfaces) of the structure represented in the depiction. Again, other representations may also be determined, as discussed above.

Depending on the nature of the depiction, the shape, curvature, and other attributes of the bounding surfaces may not be readily discernable. Therefore, according to one embodiment of the present disclosure, once the perimeter is known, attributes of bounding surfaces are established based upon various defaults or starting assumptions. For example, as a starting point, it may be assumed that all bounding surfaces are flat (unless it is apparent to the contrary from the depiction). If the user actually intended otherwise in the depiction, the user may make appropriate edits to the proposed structure design as discussed elsewhere herein. This may also be true for internal structures. For example, it may be assumed as a starting point that all floors are intended to be horizontal. There may be a great number of such starting assumptions, for bounding surfaces, internal structures, and many other aspects of the proposed structure. Therefore, without attempting to itemize all such assumptions, it will be understood by one skilled in the art that a wide range of assumptions about aspects of a structure from a depiction are contemplated herein.

The depiction data may also contain other signals useful in determining an outline and structure features, or otherwise in attempting to populate a structure representative of the depiction. Additional analyses seek to identify and utilize such signals. For example, there may be items such as people, vehicles, trees, other structures, shadows, etc. in the depiction that may assist in determining scale of the depiction (i.e., intended size of the structure) and number of floors comprising the building. There may be shading, surface illustration, or other signals in the depiction useful in determining external texture of the structure and material from which it is build (e.g., distinguishing between solid wall and window). There may be adjacent structures, property lines, roadways, etc. in the depiction useful in determining orientation of a structure on a site. Many other such signals may be present in the depiction and useful for a variety of aspects of arriving at a structure representation.

At step 126, the depiction is analyzed for such signals, and that information is utilized in the creation of a proposed structure from cell instances by the design engine. The degree to which a proposed structure design matches the depiction—a measure of its "goodness"—may be determined in a number of different ways. For example, a measure value may be decremented for each instance in which a cell instance protrudes beyond the determined structure perimeter, with a goal to maintain as high a measure value as possible. One or more cell instantiations may be substituted into the proposed structure in place of others, and the measure value reevaluated. The substitution is maintained only if the measure value is improved by so doing. A similar process may accumulate the volume of space between the edges of the proposed structure and the perimeter, with a better goodness measure being a smaller net volume. This last process may also be separated into volume inside the perimeter (closest without going over), volume outside the perimeter (closest circumscription of the perimeter), or net volume (closest to the perimeter, allowing for under- or over-shooting the perimeter).

It is also possible to generate a measure of goodness around a style derived from the depiction. For example, analysis step 124 may determine that the depiction is an effort to capture a Prairie School style of architecture, or is an effort to render a geodesic dome, and so on. Many architectural styles have distinct, quantifiable and measurable attributes. The intent may be derived from identification of such attributes combined with known search techniques. The intent may even be derived from a less sophisticated approach such as handwriting recognition applied to the portion of the architect's sketch wherein she writes "Mediterranean style", or the like. (Such a style selection may also be part of a preset preference, with similar processing as described following.) However acquired, once the preferred style of the depiction is known, the design engine may instantiate cells and select design elements in order to propose a structure in that style. The design may then be "tested" against quantified factors relating to the style, such as roof pitch, material selection, "porch" area, and so on.

As has been mentioned, the design engine may have access to a structure library containing exemplary structures in an identified (e.g., tagged) style (see FIG. 6). One or more of these exemplary structures may serve as a seed for the population of a perimeter, and with modification and testing such as described above, a structure of a desired style may be proposed, ensuring a higher style goodness measure.

A goodness measure may be specified by a user, as discussed above. In some cases, a goodness measure may also be "learned" by the system as a user interacts with the system over time. For example, if a user often edits a proposed structure to bring its perimeter inside of the boundary of the depiction, the system may learn that the goodness measure preferred by the user relates to circumscription. In other cases, the system may select a default or "guess" at a goodness measure and use that measure until instructed to use a different measure or until the system "learns" to use a different measure as discussed.

It should be noted that populating a representation as described above may be by way of an analytical operation, a search operation, or a combination of the two. For example, in an analytical operation, one or more primitive cells are instantiated to roughly approximate the depicted structure. Rules for improving the fit of the cells to the structure are employed, and an optimized structure proposed, such as by use of the goodness measures discussed above. In a search operation, a collection of known structures is search for a closest match. A proposed structure begins with the closest match, or a composite of several closest match pre-existing structures or portions of structures. Again, the fit of the proposed structure may be determined, such as by the goodness measure. In one example of a combined approach, further fitting from the analytical operation refines the best fit from the search operation.

At this point, the design engine has developed a proposed design (albeit perhaps merely a preliminary design) in response to the depiction. The proposed design may be rendered at step 128. With reference again to FIG. 2, rendering may take place for example in design workspace 82. Tools and other user interface elements 84 may be provide to allow the user to select different views of the proposed structure, edit the proposed structure, and so on.

An attributes engine 160 receives design data from design engine 68. This includes data about the proposed structure, cells, system, and components of the design. Attributes engine 160 calculates various attributes (e.g., cost, area, build time, efficiency, etc.) from this data, and provides those calculated attributes to be displayed in a dashboard 162. This is also illustrated at steps 130, 132 of FIG. 7.

One benefit of this process is that starting from a sketch or other depiction, a user may very quickly be provided with substantial data about a structure based on the sketch or other depiction. This is illustrated in one embodiment according to the present disclosure shown in FIG. 8, in which a user 170, working on tablet computer 172, is provided with a view on the tablet of the site 174 and environment 176 in which a proposed structure is to be built. User 170 is able to sketch on the tablet, over the displayed site and environment, a depiction 178 of a structure. Data representing depiction 178 may be sent in real-time to a design engine running on a remote computer. The design engine may analyze the depiction data and produce a proposed structure, as discussed above. The remote computer may communicate with tablet computer 172 to render a proposed structure in the scene of the site and environment. Various attributes about the structure may be calculated by the remote computer and presented in dashboard 180, virtually as the user is sketching the depiction of the structure. (Of course, if tablet computer 172 has sufficient processing capabilities and memory, it may handle the analyses and development of the proposed structure design and rendering independent of any remote computer.)

Returning to FIG. 7, at steps 134 and 136 the user may be provided with controls to manually edit the proposed structure. Such manual editing may be by way of a design editing interface (e.g., element 84, FIG. 2). If the proposed structure is manually edited, the structure design is revised (e.g., user edits are checked against various rules) by the design engine at 126. It is worth noting that that the user may edit either the depiction or the proposed structure at this part of the process. Any ambiguities, errors, or assumptions may be highlighted at step 138, and the user invited to address them one way or another (such as by correction, ignoring them, flowing links to further information, etc.) at step 140, by way of a suitable user interface.

Optionally, at step 142 the goodness measure of the proposed structure is determined. The goodness measure may be used to initiate a refinement process prior to providing a proposed structure design to the user. Alternatively, the process may "solve for" the goodness measure analytically so that it produces only one structure and that structure is the best structure they system can propose relative to the goodness measure. The proposed structure might not have a "perfect" goodness measure, but in certain cases the system can produce an initial design that presents a global maximum of a certain goodness measure (that is, without any required refinement) from a depiction (at least with respect to that goodness measure. In fact, even if the system merely provides a design having a local maximum, the system can produce a single proposed structure that is acceptable relative to the goodness measure, and present that proposed structure immediately to the user without any refinement. In this case, the goodness measure may simply be used to confirm the initial maximum for the proposed structure, or optionally it may be displayed to the user, such as at step 144.

The user may be provided with a number of controls to modify system instructions as to which assumptions to make, which goodness measure to optimize for, and so on. The user may also be provided with an interface to edit a number of other controls over the structure such as a preferences or targets for items such as maximum cost, build time, square footage, efficiency, etc. at any time during the structure design process.

Figure 8:
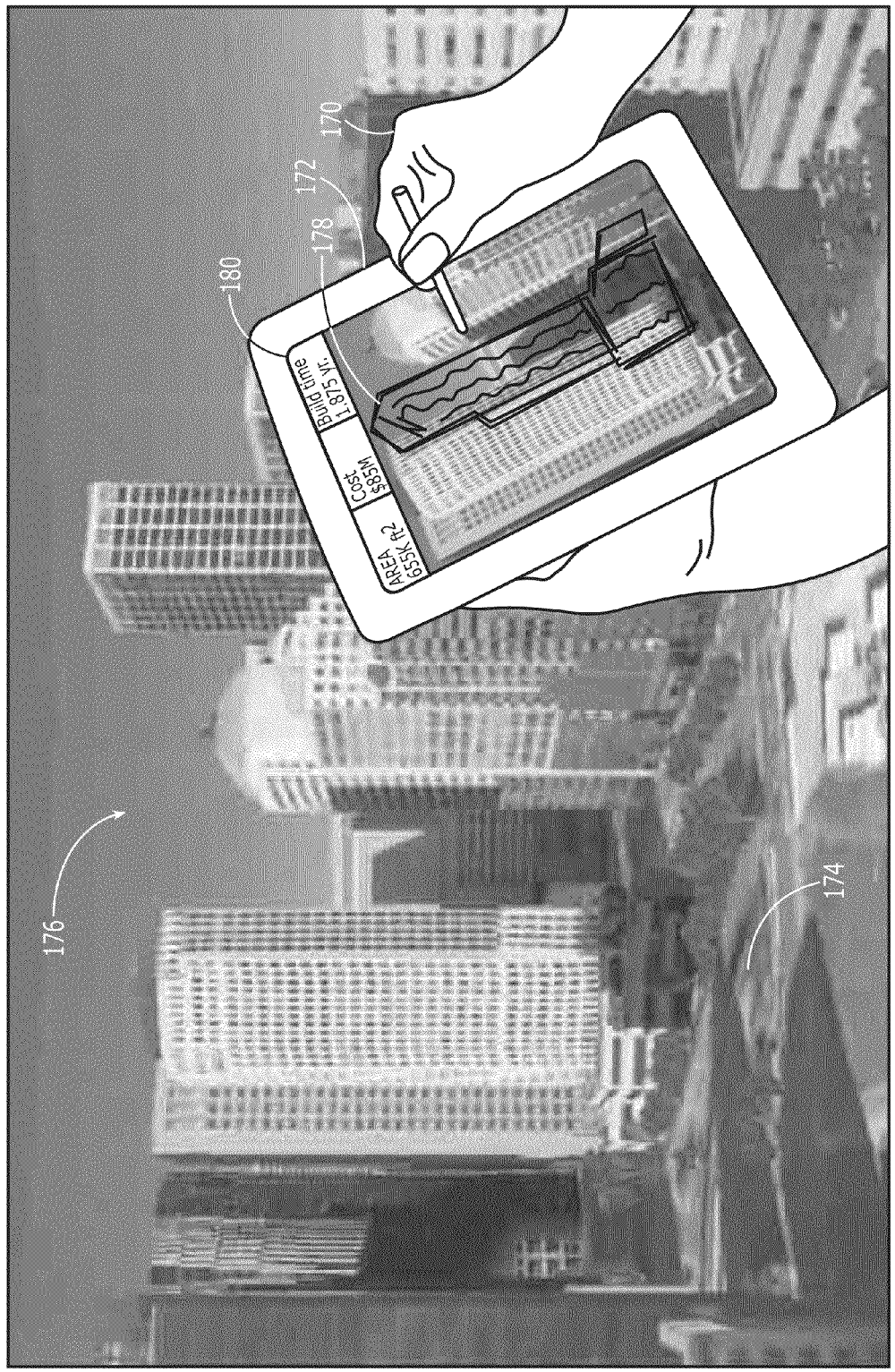
FIG. 8 is an illustration of a sketch for a structure being developed on a tablet computing device, with an image of the building site and its environment as well as a dashboard with estimated attributes for the sketched structure, displayed according to the present disclosure.
Figure 9:
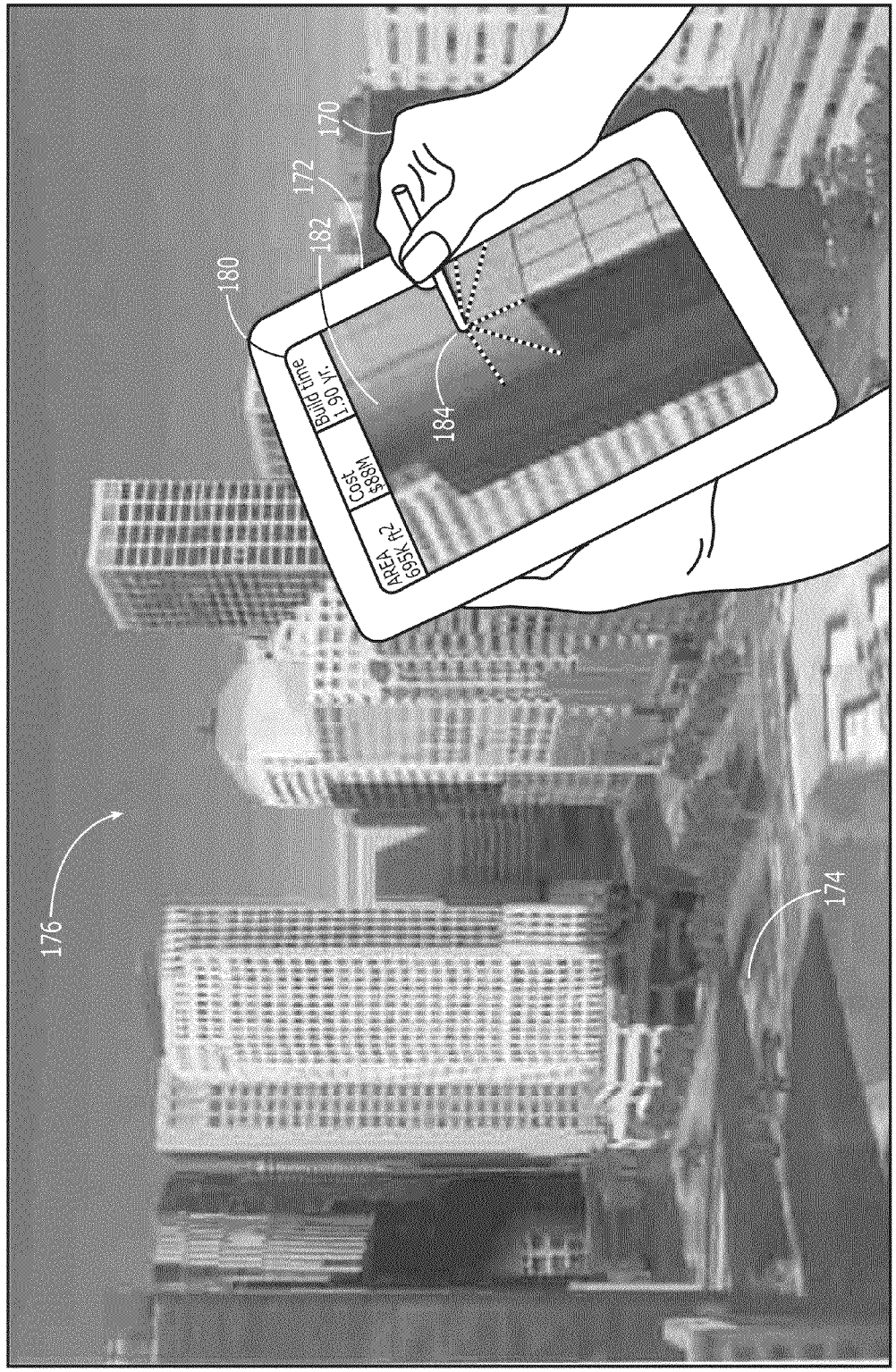
FIG. 9 is an illustration of a computer-based proposed structure, based on the sketch shown in FIG. 8, being edited on a tablet computing device, with an image of the building site environment and a dashboard with updated estimated attributes for the sketched structure, displayed according to the present disclosure.

Further to the tablet example of FIG. 8, the editing of a proposed structure according to an embodiment of the present disclosure is illustrated in FIG. 9. Again, a user 170, working on tablet computer 172, is provided with a view on the tablet of the site 174 and environment 176 in which a proposed structure is to be built. A sketch provided by user 170 has been processed by a design engine, and a proposed structure 182 has been rendered in the context of site 174 and environment 176. User 170 is able to edit proposed structure 182, using appropriate editing tools 184, directly on the tablet, over the displayed site and environment. The edited structure may be analyzed by the design engine and further information provided to the user, such as errors or ambiguities needing resolution. The various attributes about the structure presented in dashboard 180 may also be updated, virtually as the user is editing the depiction of the structure.

It will be appreciated that in addition to the depiction and rules discussed above, the structure proposed by design engine 68 may take into account building codes, rules relating to the intended use of the proposed structure, site data such topography, geology, and meteorology, zoning data, historical real estate data, neighborhood information (key services, pedestrian and vehicular traffic flow), physical form of neighboring buildings, etc. Many of these other factors can be visible when rendering onsite, as illustrated in the examples of FIGS. 8 and 9, providing the architect, client, and others with a real-time view of how those factors can influence the structure design.

Figure 10:
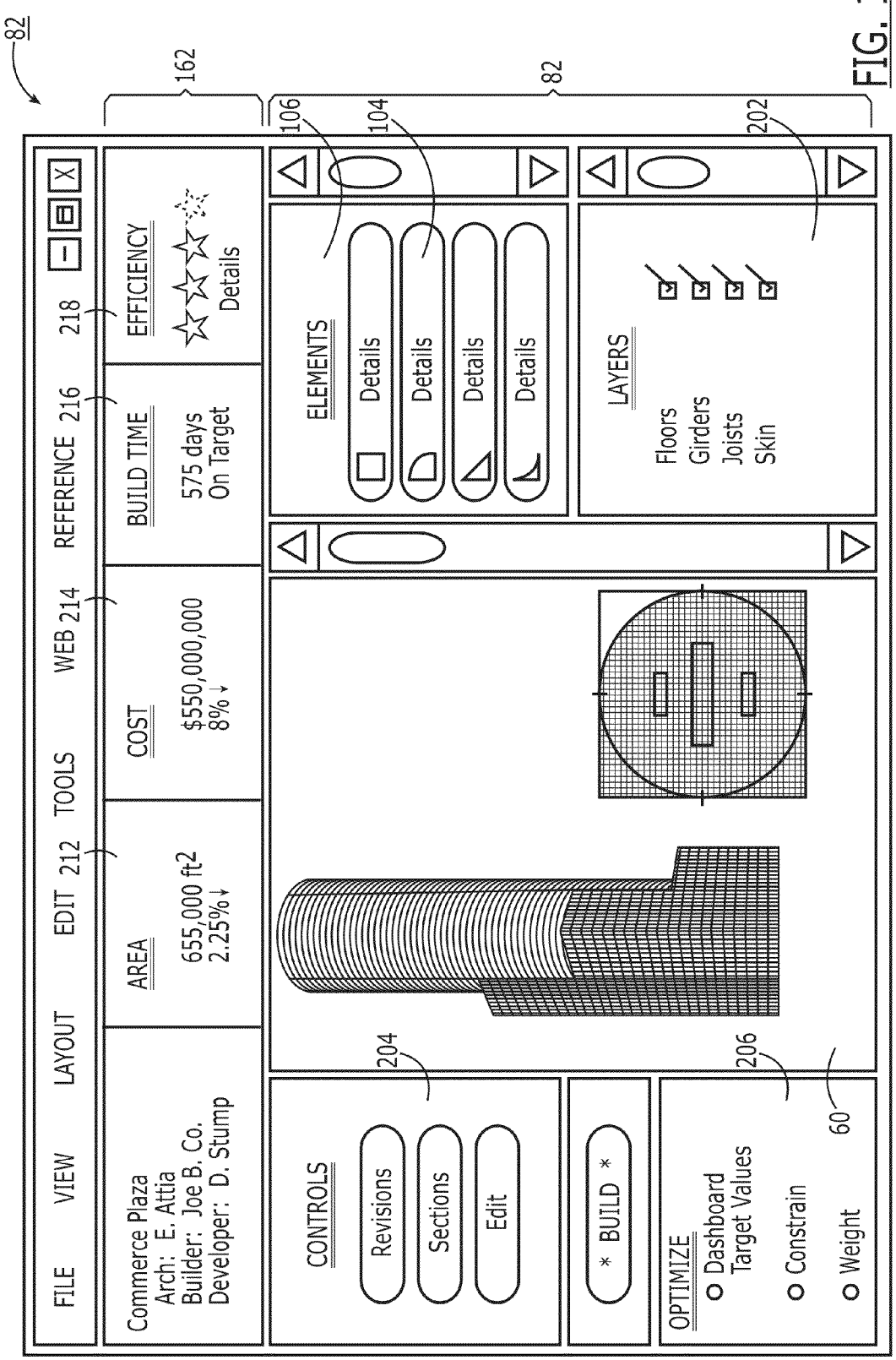
FIG. 10 is an example of a user interface within which a user may view and edit a design, view various attributes of the design in a dashboard, and view other aspects of the design and processes according to the present disclosure.

With reference to FIG. 10, in one embodiment design UI 82 includes a number of view controls, 202, function controls 204, 206, and a dashboard 162 in which various quantified attributes of the structure may be displayed to provide user feedback. While shown as part of UI 82, dashboard 162 may be provided as a separate UI or part of a different UI forming a part of the system disclosed herein. Dashboard 162 may provide a calculated square footage 212, total cost 214, time-to-completion 216, energy efficiency, 218, and so on. In addition to, or as an alternative to providing these and other attributes for the complete structure, dashboard 162 can provide a user with these attributes and others for selected portions of a structure (not shown).

Returning to FIG. 3, as described to this point system 70 has either autonomously or with user input created a structure design that captures a users intent from a depiction of a structure, as well as a structure that complies with rules governing the design, such as rules related to stability, safety, building codes, and so on. In addition, system 70 may iteratively optimize the design, presenting proposed improvements over time. Such optimization may be based on results from extended searches for similar designs, analytical improvements, and so on. Such optimization is distinct from the aforementioned goodness. The former is centered on meeting codes, user-set targets, and so forth, while the latter is centered on how well the proposed structure design aligns with the initial depiction.

According to one embodiment, an optimization engine 240 receives design data from design engine 68 (optionally together with targets and other optimization selections from UI 244) and modifies aspects of the design, such as by using alternate cells rules, systems or components, changing the form or footprint of the design, reorienting the design on the building site, and so on. It then tests the design against one or more measures to determine if the modification produces an improved design.

In certain design programs it may be desired to restrict elements from the depiction that system 70 can change in the optimization process. For example, a user may wish to retain a round footprint, a certain curtain wall design, and so on, and have system 70 try to optimize the design by changing other aspects of the design. An optimization controls and selection user interface 242 is provided to permit the user to make such restriction selections. The user may also be permitted to weight certain decisions, and to select one criteria over another (e.g., optimize first, and thereafter refine design with a goodness measure).

At any point in the design process a user (or the system, automatically) may save and annotate a revision. For example, a user may save a version of the design, initiate an optimization, and then save the new design provided in response to the optimization. This allows the user to later compare the options, provide the options to a client for consideration, to an engineer for additional comparisons, to a builder for more refined bids and time estimates, and so on.

It will be appreciated that a system according to the present disclosure is well suited for collaborative structure development. In one embodiment, many elements of system 70 may reside in a "cloud"-computing environment, and the user interacts with the system via specific application software, a web browser, etc. Thus, numerous parties can provide input to the design and process of developing the structure. That is, parties may collaborate on the design, such several architects working together on a single design, an owner or developer providing design preferences, an interior designer working on the interior layout of the structure, a builder providing refinements relating to practicality of building the structure, or all such parties (and, of course, possibly other interested parties) working together. Appropriate revision control is provided, such as by techniques otherwise known in the art.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A computer-implemented method of designing a structure, comprising:
    inputting to a computer subsystem a depiction of a structure;
    analyzing, in a computer subsystem, said depiction in order to determine aspects of said structure indicated in said depiction;
    generating, in a computer subsystem, a proposed structure design based on said aspects of said structure indicated in said depiction by instantiating and interconnecting a plurality of cells;
    calculating, in a computer subsystem, a measure of how well said proposed structure design matches said depiction, wherein said measure of how well said proposed structure design matches said depiction comprises:

(i) determining a set of primitive geometric shapes comprising said depiction, and how said primitive geometric shapes relate to one another in space; and (ii) determining the extent that said proposed structure design contains said set of primitive geometric shapes, and how said primitive geometric shapes relate to one another in space in said proposed structure design when compared to how said primitive geometric shapes relate to one another in space in said depiction; and rendering said proposed structure design in a design workspace.

2. The computer-implemented method of claim 1, further comprising:

refining, in a computer subsystem, said proposed structure design in response to said calculation of how well said proposed structure design matches said depiction; and rendering said proposed structure comprises rendering said refined proposed structure.

3. The computer-implemented method of claim 1, further comprising:

quantifying, in a computer subsystem, measures of various attributes of said proposed structure design during the process of generating said proposed structure design; and displaying said quantified measures in a dashboard associated with said design workspace.

4. The computer-implemented method of claim 1, further comprising:

receiving, at an editing interface, edits to said proposed structure design;

modifying said proposed structure design in response to said edits; and rendering said modified proposed structure design in said design workspace.

5. The computer-implemented method of claim 4, further comprising:

calculating, in a computer subsystem, a measure of how well said modified proposed structure design matches said depiction;

refining, in a computer subsystem, said modified proposed structure design in response to said calculation of how well said modified proposed structure design matches said depiction; and rendering said refined, modified proposed structure design in said design workspace.

6. The computer-implemented method of claim 1, wherein said measure of how well said proposed structure design matches said depiction comprises:

determining a perimeter from said depiction; and determining how often, to what degree, or both how often and to what degree said proposed structure design extends beyond said perimeter.

7. The computer-implemented method of claim 1, wherein said measure of how well said proposed structure design matches said depiction comprises:

determining an intended design style from said depiction; and determining from a plurality of indicators of the presence of said design style the extent to which said proposed structure design matches said determined intended design style.

8. The computer-implemented method of claim 1, further comprising:

identifying, by a computer subsystem, violations of codes, rules, ordinances, and regulations, resulting from said proposed structure design that are not autonomously resolved by said computer subsystem generating a proposed structure design; and providing, at a user interface, said identified violations and a mechanism permitting a user to make selections to either resolve, postpone, or ignore said identified violations.

9. The computer-implemented method of claim 1, further comprising:

inputting to a computer subsystem multiple different depictions of a structure;

analyzing, in a computer subsystem, said multiple different depictions in order to determine aspects of said structure indicated in said depictions.

10. The computer-implemented method of claim 9, in which said multiple different depictions comprise multiple different views of a structure.

11. The computer-implemented method of claim 1, wherein said depiction of a structure is a data file selected from the group consisting of: computer-aided drawing files; computer-based sketching files; scanned hand drawing files; scanned photograph files; digital image files; digital video files; and scanned three-dimensional model files.

12. The computer-implemented method of claim 1, wherein said depiction is analyzed for signals contained therein from which aspects of the depiction may be determined.

13. The computer-implemented method of claim 12, wherein said aspects are selected from the group consisting of: structure scale; structure material; and structure orientation on a site.

14. The computer-implemented method of claim 1, further comprising:

rendering an image of a building site and environment around said building on an input/output device; and receiving said depiction on said input/output device.

15. The computer-implemented method of claim 14, further comprising:

analyzing relationships between said site, said environment around said site, and said depiction in order to determine aspects of said of said depiction; and utilizing said aspects of said depiction in said generation of a proposed structure design.

16. The computer-implemented method of claim 15, wherein said aspects are selected from the group consisting of: structure scale; structure material; and structure orientation on a site.

17. The computer-implemented method of claim 14, further comprising:

rendering said proposed structure design on said input/output device.

18. The computer-implemented method of claim 17, further comprising:

receiving, at an editing interface on said input/output device, edits to said proposed structure design;

modifying said proposed structure design in response to said edits; and rendering said modified proposed structure design in said design workspace.

19. The computer-implemented method of claim 17, further comprising:

quantifying, in a computer subsystem, measures of various attributes of said proposed structure design during the process of designing said structure; and displaying said quantified measures in a dashboard on said input/output device.

20. The computer-implemented method of claim 19, further comprising:
   receiving, at an editing interface on said input/output device, edits to said proposed structure design;
   modifying said proposed structure design in response to said edits;
   rendering said modified proposed structure design in said design workspace;
   quantifying, in a computer subsystem, measures of said various attributes of said modified proposed structure design during the process of editing said proposed structure design; and
   updating said displaying of said quantified measures for said modified proposed structure design in said dashboard on said input/output device.

21. A computer-based system for designing a structure, comprising:
   an input subsystem for inputting a depiction of a structure;
   an analysis subsystem, communicatively coupled to said input subsystem, for analyzing said depiction in order to determine aspects of said structure indicated in said depiction;
   a design engine, communicatively coupled to said analysis subsystem, for generating a proposed structure design based on said aspects of said structure indicated in said depiction by instantiating and interconnecting a plurality of cells;
   a goodness measurement subsystem, communicatively coupled to said design engine, for calculating a goodness measure indicative of how well said proposed structure design matches said depiction by determining:
      (i) a set of primitive geometric shapes comprising said depiction, and how said primitive geometric shapes relate to one another in space; and
      (ii) the extent that said proposed structure design contains said set of primitive geometric shapes, and how said primitive geometric shapes relate to one another in space in said proposed structure design when compared to how said primitive geometric shapes relate to one another in space in said depiction; and
   a display device for displaying a rendering of said proposed structure design in a design workspace;
   whereby said design engine is configured to refine said proposed structure design in response to said goodness measure.

22. The computer-based system of claim 21, further comprising:
   an attributes quantification subsystem, communicatively coupled to said design engine, for quantifying measures of various attributes of said proposed structure design during the process of generating said proposed structure design; and
   a display device, communicatively coupled to said attributes quantification subsystem, for displaying said quantified measures in a dashboard associated with said design workspace.

23. The computer-based system of claim 21, further comprising:
   an editing interface, communicatively coupled to said design engine, for receiving edits to said proposed structure design;
   said design engine configured to modify said proposed structure design in response to said edits; and
   said display device configured to render said modified proposed structure design in said design workspace.

24. The computer-based system of claim 23, wherein:
   said goodness measurement subsystem is configure to calculate a goodness measure of how well said modified proposed structure design matches said depiction;
   said design engine configured to refine said modified proposed structure design in response to said calculation of how well said modified proposed structure design matches said depiction; and
   said display device configured to render said refined, modified proposed structure design in said design workspace.

25. The computer-based system of claim 21, wherein said goodness measurement subsystem is configure to determine:
   a perimeter from said depiction; and
   how often, to what degree, or both how often and to what degree said proposed structure design extends beyond said perimeter.

26. The computer-based system of claim 21, wherein said goodness measurement subsystem is configure to determine:
   an intended design style from said depiction; and
   from a plurality of indicators of the presence of said design style the extent to which said proposed structure design matches said determined intended design style.

27. The computer-based system of claim 21, wherein said design engine is configure to identify violations of codes, rules, ordinances, and regulations, resulting from said proposed structure design that are not autonomously resolved by said design engine, and further comprising:
   an interface, communicatively coupled to said design engine, to provide said identified violations to a user and to permit said user to make selections to either resolve, postpone, or ignore said identified violations.

28. The computer-based system of claim 21, wherein:
   said input subsystem is configure to receive multiple different depictions of a structure; and
   said analysis subsystem is configured to analyze said multiple different depictions in order to determine aspects of said structure indicated in said depictions.

29. The computer-based system of claim 28, in which said multiple different depictions comprise multiple different views of a structure.

30. The computer-based system of claim 21, wherein said depiction of a structure is a data file selected from the group consisting of: computer-aided drawing files; computer-based sketching files; scanned hand drawing files; scanned photograph files; digital image files; digital video files; and scanned three-dimensional model files.

31. The computer-based system of claim 21, wherein said analysis subsystem is configure to analyze said depiction for signals contained therein from which aspects of the depiction may be determined.

32. The computer-based system of claim 31, wherein said aspects are selected from the group consisting of: structure scale; structure material; and structure orientation on a site.

33. The computer-based system of claim 21, wherein said input subsystem and said display device comprise an input/output device configured to render an image of a building site and environment around said building and to receive said depiction.

34. The computer-based system of claim 33, wherein:
   said analysis subsystem is configured to analyze relationships between said site, said environment around said site, and said depiction in order to determine aspects of said of said depiction; and
   said design engine is configured to utilize said aspects of said depiction in said generation of said proposed structure design.

35. The computer-based system of claim 34, wherein said aspects are selected from the group consisting of: structure scale; structure material; and structure orientation on a site.

36. The computer-based system of claim 33, wherein said input/output device is further configured to render said proposed structure design.

37. The computer-based system of claim 36, wherein:
said input/output device is configured to receive edits to said proposed structure design;
said design engine is configured to modify said proposed structure design in response to said edits; and
said input/output device is further configured to render said modified proposed structure design in said design workspace.

38. The computer-based system of claim 36, further comprising:
an attributes quantification subsystem, communicatively coupled to said design engine, for quantifying measures of various attributes of said proposed structure design during the process of generating said proposed structure design; and
said input/output device is configured for displaying said quantified measures in a dashboard associated with said design workspace.

39. The computer-based system of claim 38, wherein:
said input/output device is configured to receive at an editing interface edits to said proposed structure design;
said design engine is configured to modify said proposed structure design in response to said edits;
said input/output device is further configured to render said modified proposed structure design in said design workspace;
said attributes quantification subsystem configured to quantify measures of said various attributes of said modified proposed structure design during the process of editing said proposed structure design; and
said input/output device further configured to update said display of said quantified measures for said modified proposed structure design in said dashboard on said input/output device.

40. A non-transitory computer readable medium having computer program logic stored thereon executable on one or more processors for facilitating collaborative structure design efforts, and for coordinating implementation of a resulting design, the computer program logic comprising:
code for implementing input to a computer subsystem of a depiction of a structure;
code for analyzing said depiction in order to determine aspects of said structure indicated in said depiction;
code for generating a proposed structure design based on said aspects of said structure indicated in said depiction by instantiating and interconnecting a plurality of cells;
code for calculating a measure of how well said proposed structure design matches said depiction;
code for refining said proposed structure design in response to said calculation of how well said proposed structure design matches said depiction;
code for rendering said proposed structure design in a design workspace;
code for rendering an image of a building site and environment around said building on an input/output device;
code for receiving said depiction on said input/output device;
code for rendering said proposed structure design on said input/output device;
code for quantifying measures of various attributes of said proposed structure design during the process of designing said structure;
code for displaying said quantified measures on said input/output device; and
code for analyzing said depiction for signals contained therein from which aspects of the depiction may be determined, wherein said signals include adjacent structures in said depiction of the structure to determine a scale of the depiction.

* * * * *